(12) United States Patent
Krishnan et al.

(10) Patent No.: US 7,071,044 B1
(45) Date of Patent: Jul. 4, 2006

(54) METHOD OF MAKING A TEST STRUCTURE FOR GATE-BODY CURRENT AND DIRECT EXTRACTION OF PHYSICAL GATE LENGTH USING CONVENTIONAL CMOS

(75) Inventors: Srinath Krishnan, Campbell, CA (US); William George En, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 10/838,229

(22) Filed: May 5, 2004

(51) Int. Cl.
*H01L 21/336* (2006.01)

(52) U.S. Cl. .................................... 438/197; 438/14
(58) Field of Classification Search .................. None
See application file for complete search history.

(56) References Cited

U.S. PATENT DOCUMENTS

| | | | |
|---|---|---|---|
| 5,532,176 A * | 7/1996 | Katada et al. | 438/232 |
| 5,622,880 A * | 4/1997 | Burr et al. | 438/194 |
| 6,204,138 B1 | 3/2001 | Krishnan et al. | |
| 6,238,960 B1 * | 5/2001 | Maszara et al. | 438/197 |
| 6,429,054 B1 | 8/2002 | Krishnan et al. | |
| 6,441,433 B1 | 8/2002 | En et al. | |
| 6,521,946 B1 * | 2/2003 | Mosher | 257/336 |

* cited by examiner

*Primary Examiner*—Thao P. Le

(57) ABSTRACT

A structure for testing relative to an MOS transistor, can be easily constructed as part of the CMOS process flow. A doped device well is formed, for example, in a silicon-on-insulator structure. The concentration level in the well corresponds to that for a well of the transistor. Gate insulator and polysilicon layers are formed, and the polysilicon is implanted with dopant, to a concentration level expected in the transistor gate. After gate patterning, the methodology involves forming sidewall spacers and implanting dopant into the active device well, to form regions in the test structure corresponding to the transistor source and drain. Although the concentrations mimic those in the transistor source and drain, these test structure regions are doped with opposite type dopant material. The test structure enables accurate measurement of the gate-body current, for modeling floating body effects and/or for measurement of gate length.

18 Claims, 8 Drawing Sheets

METHOD OF MAKING A TEST STRUCTURE FOR GATE-BODY CURRENT AND DIRECT EXTRACTION OF PHYSICAL GATE LENGTH USING CONVENTIONAL CMOS

FIELD OF THE INVENTION

The present subject matter relates to a method of manufacturing a test structure, typically in association with a semiconductor device of interest, which can be measured or tested to determine significant operational and/or structural parameters of the semiconductor device.

BACKGROUND

Metal Oxide Semiconductor (MOS) type transistors are a fundamental building block within integrated circuits. Consequently, there is a persistent push to make such devices smaller, faster, etc. An MOS transistor, includes a body region of a first semiconductor type (e.g. a P-type region). The body region has two spaced regions (source and drain) of the opposite semiconductor type (e.g. N-type). Typically, the source and drain regions have lightly doped extension regions of the same semiconductor type (N-type, in our example) although the doping concentration is lower. The region of the body between the source and drain is referred to as the "channel." The extension regions help overcome short channel transistor effects as device dimensions continue to shrink. A doped polysilicon gate overlies a thin gate oxide. The gate and oxide overly the channel region in the body, between the source and drain.

The silicon-on-insulator (SOI) type MOS structure was developed to improve performance, for example by reducing junction capacitances. This technology involves forming the MOS transistor on an insulating region. The SOI transistor has components similar to the MOS transistor device formed on a bulk semiconductor substrate as described above, however, the body overlies an insulating layer, such as silicon dioxide ($SiO_2$). The insulating layer, in turn, overlies a bulk semiconductor material. Conventional SOI types of structures have evolved and basically comprise a substrate, such as a silicon-containing substrate, an insulating layer thereon, commonly referred to as a buried oxide layer, and a monocrystalline silicon layer on the insulating layer which constitutes the "body" of the transistor.

An SOI based transistor structure provides several performance advantages over traditional bulk transistor devices. For example, each device in an SOI structure is completely isolated from all other devices (as opposed to sharing a common substrate body). Consequently, the SOI provides better individual device isolation, which prevents circuit latch-up conditions. Also, in most SOI devices, at least a portion of each source or drain region abuts the underlying insulating layer. As a result, the cross sectional area of the source/drain interfaces to the semiconductor body are reduced, and this reduces the junction capacitances. When an electrical signal changes on either or both source/drain regions, there is no capacitive coupling to the substrate. Certain electrical elements of the circuit can be positioned closer together, thereby reducing the die size. SOI structures offer the advantages of latch-up immunity, reduced junction leakage currents and reduced short channel effects, thereby translating to increased transistor speed.

In SOI devices, the body floats in that there is no direct electrical connection thereto. In some cases, this can be disadvantageous. "Floating body effects" are a class of hysteresis effects produced because the voltage of the semiconductor body is allowed to float relative to ground. Examples of floating body effects include the "kink" effect and the parasitic lateral bipolar effect. The "kink" effect originates from impact ionization. When the SOI transistor is operated at a relatively high drain-to-source voltage, channel electrons having sufficient kinetic energy cause an ionizing collision with the lattice, resulting in carrier multiplication near the drain end of the channel. The generated holes build up in the body of the device, thereby raising the body potential. The increased body potential reduces the threshold voltage of the transistor, thus increasing the transistor current, which results in a "kink" in the transistor current/voltage curves. If impact ionization generates a large number of holes, the body bias may be raised to a sufficient voltage so that the source/body p-n junction becomes forward biased. When this junction becomes forward biased, minority carriers are emitted into the body, which causes a parasitic lateral npn bipolar transistor to turn on. This parasitic lateral bipolar transistor effect leads to a loss of gate control of the transistor current and is therefore highly undesirable.

The flow of current between the gate and the body is a relevant parameter having an impact on the above-noted floating body effects. To assess such effects, it is useful to measure the gate-body current of an SOI transistor. However, existing techniques involve making a body tie or connection to the body of the actual device (that otherwise would be floating) and measuring current flow between the gate and the tied body. Characterization or measurement of this component in this manner is difficult, since tied-body structures used to extract the measure of the gate-body current introduce a large error due to the body tie connection to the device. Essentially, the extrinsic gate-body current in a device that has a tie or contact to the body for the measurement overwhelms the intrinsic gate-body current produced solely by the device operation without the tie, due to the topology/behavior of the body tie. Often, the extrinsic gate-body current due to the body tie is 10 to 100 times larger than the intrinsic gate-body current.

In developing and scaling MOS technologies, it is also useful to know the physical gate length. However, there currently is no convenient technique for directly measuring the physical gate length of an MOS transistor, in SOI or bulk technologies.

Hence, there is a need for a test structure and a testing technique, which enable the desirable testing of gate-body current and physical gate length. To provide the needed test structure, there is an attendant need for a technique to construct the test structure, so as to enable accurate measured representation of the parameters relevant to the actual MOS devices.

SUMMARY OF THE INVENTION

Applicants have developed a test structure, to facilitate test measurements that accurately characterize aspects of an MOS transistor. Although separate from the MOS device, the test structure closely mimics the MOS device. The disclosure herein focuses on techniques for producing the test structure, for example, during manufacture of the MOS device of interest. The MOS device and the test structure may be elements constructed on a bulk semiconductor substrate, however, the methodology and the test structure are particularly advantageous when applied in the context of silicon-on-insulator (SOI) type integrated circuits.

A method of making the test structure involves forming an active device well, for example, in a silicon-on-insulator structure including a substrate, an insulator on the substrate and a semiconductor layer on the insulator. In the SOI example, the active device well comprises an isolated region of the semiconductor layer. The method also involves implanting a dopant of a first semiconductor type in the active device well, to a concentration level specified for a well of the transistor.

In an exemplary embodiment for emulating an MOS transistor, the well doping would be P-type, as in the well for the transistor. In a PMOS example, the well doping would be N-type, as in the well for the transistor. This initial doping of the well may be followed by a channel threshold implant.

The method of making the test structure also includes forming a gate insulator layer over the active device well, and forming a polysilicon layer on the gate insulator layer. In an exemplary embodiment, the initial doping of the well and a channel threshold implant are performed after forming the insulator layer, but before forming the polysilicon layer.

In subsequent processing, dopant of a second semiconductor type is implanted in the polysilicon layer, to a concentration level expected in the transistor gate. In an embodiment where the test structure is made during the manufacture of the transistor, this part of the process involves an initial implantation performed for gates of both devices. However, the gate of the transistor will be subject to doping during some later steps, which is blocked off from further implantation in the gate for the test structure. Hence, the example for making the test structure involves an extra implantation in the area of polysilicon for the test structure gate, in order to bring the concentration up to the level expected in the transistor gate.

After dopant implantation in the polysilicon, the method involves patterning the polysilicon layer to form a gate for the test structure. At least one dimension of the gate of the test structure substantially corresponds to a dimension specified for the gate of the transistor. In examples, the width and length of the gate for the test structure are approximately the same as in the transistor of interest for testing purposes.

The method of making the test structure also includes forming insulating spacers on sidewall surfaces of the gate for the test structure. Dopant of the first semiconductor type is implanted into the active device well, to form regions in the test structure. These regions correspond to the source and drain of the transistor of interest; although of the regions in the test structure are doped with opposite type dopant material. The regions in the test structure, however are implanted to a concentration level that is substantially equal to a concentration of dopant of the second semiconductor type that is specified for or otherwise expected in source and drain regions of the transistor.

As a result of the process, the test structure has certain properties that are quite similar to those of the transistor of interest. For example, the gate is substantially similar in at least one dimension and in resistivity (due to similar dopant concentration), to the gate of the transistor of interest. The channel region and body have similar properties, although in the examples, the test structure does not have any source/drain extensions to shorten the channel or create overlaps with the gate. Overlap prevents scaling of gate current to gate or channel length. Since the examples have no overlap, the test structure exhibits a substantially linear relationship of gate current to gate/channel length. A difference in length results in a corresponding difference in current.

The test structure physically resembles an MOS transistor, but because of the use of different semiconductor type dopant in the regions corresponding to the source and drain, the test structure essentially functions as an MOS capacitor. The regions enable a connection to the body of the structure, which can be used to measure a gate-body tunneling current. The measured current will be substantially similar to the current in the transistor of interest during actual operation of the transistor. Hence, it is possible to measure and derive information from the gate-body current of the test structure, without the need to provide a body tie or contact to the body of an actual transistor.

Examples of test applications include measurement of the gate-body current, as a parameter impacting the above-discussed floating body effects on the transistor of interest. Another exemplary application utilizes a gate current measure on the test structure as a measure of the actual physical gate length of the transistor of interest.

The manufacturing techniques described herein allow efficient production of the test structure as an integral part of processing to make CMOS integrated circuits incorporating the test structure as well as one or more of the transistors of interest.

Additional objects, advantages and novel features of the examples will be set forth in part in the description which follows, and in part will become apparent to those skilled in the art upon examination of the following and the accompanying drawings or may be learned by production or operation of the examples. The objects and advantages of the inventive concepts may be realized and attained by means of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

DETAILED DESCRIPTION OF THE EXAMPLES

The various techniques disclosed herein relate to semiconductor processing to construct a test structure, which is useful in measuring gate-body currents in MOS transistor devices and/or in measurement of gate current as a means to measure physical gate length of a transistor device. The test structure is designed to mimic an MOS device of interest for testing and analysis purposes, so that tests on the test structure provide desired information regarding the MOS device of interest. The MOS device and the test structure may be elements constructed on a bulk semiconductor substrate, however, the methodology and the test structure are particularly advantageous when applied in the context of silicon-on-insulator (SOI) type integrated circuits.

Figure 1:
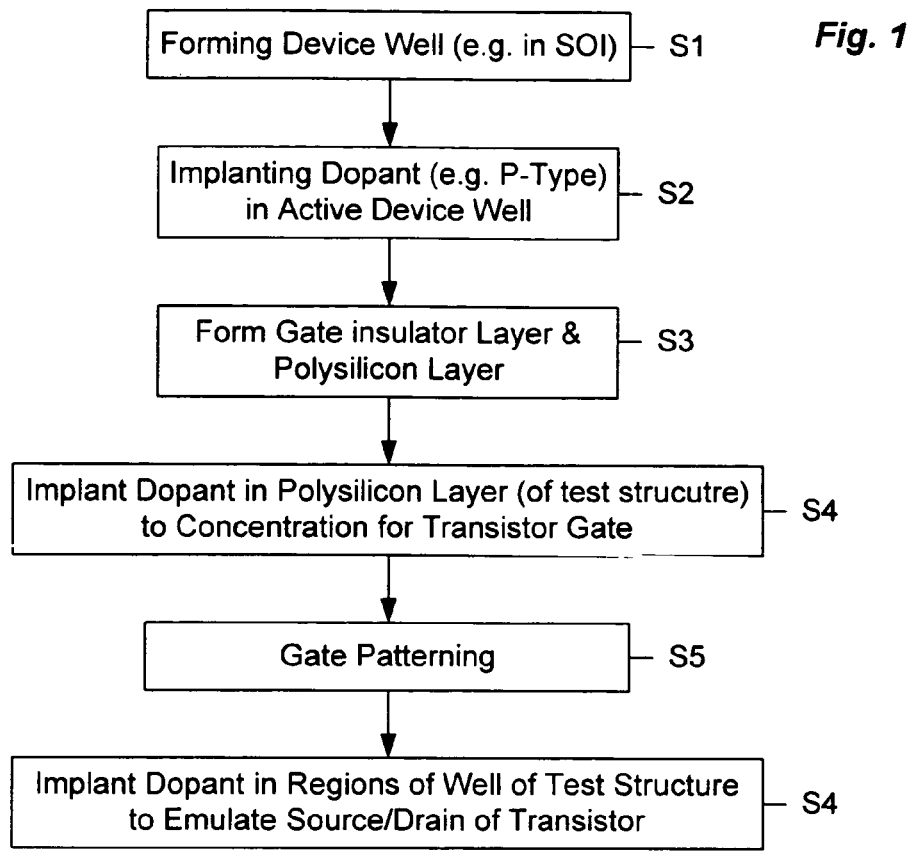
FIG. 1 is a simplified flow chart diagram useful in providing a high-level explanation of the processing steps involved in manufacturing the test structure.

Since the techniques of particular interest at this point relate to manufacture of the test structure, an exemplary manufacturing process is described, first at a high level with regard to FIG. 1 and then in more detail with reference to an example shown in FIGS. 2–17. Exemplary test operations and the advantages thereof are discussed later, with regard to FIGS. 18 and 19.

Although the present manufacturing technique is described in the context of fabricating an NMOS type device and a corresponding test structure, those skilled in the art will recognize that the technique is readily adaptable to production of a PMOS type device and a corresponding test structure. It will be appreciated that the technique is applicable to a variety of other types of transistor devices. The present description will enable those skilled in the art to practice the manufacturing technique to produce test structures associated with a vast number of different types of transistor devices.

FIG. 1 is a simplified flow chart outlining the processing steps involved in manufacturing the test structure. As shown, the method involves forming an active device well (step S1), for example, in a silicon-on-insulator structure including a substrate 111, an insulator 113 on the substrate 111, and a semiconductor layer 115 on the insulator 113 (see FIG. 2). In the SOI example, the active device well 121 comprises an isolated region of the semiconductor layer, for example, separated from other wells 119 by isolation barriers 117.

The method (FIG. 1) also involves a step S2 of implanting a dopant 125 of a first semiconductor type in the active device well, to a concentration level expected for a well of the transistor. In an example for emulating an NMOS transistor, the doping of the well 121 would be P-type, as in the well 119 for the transistor. In a PMOS example, the well doping would be N-type, as in the well for the PMOS transistor.

Figure 5:
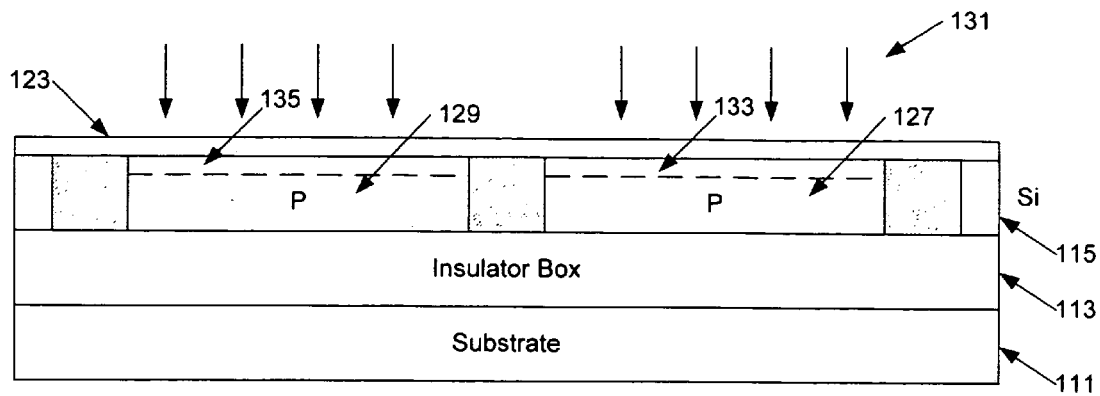
FIG. 5 is a cross-sectional view of the SOI structure showing the N-channel threshold implant step.
Figure 6:
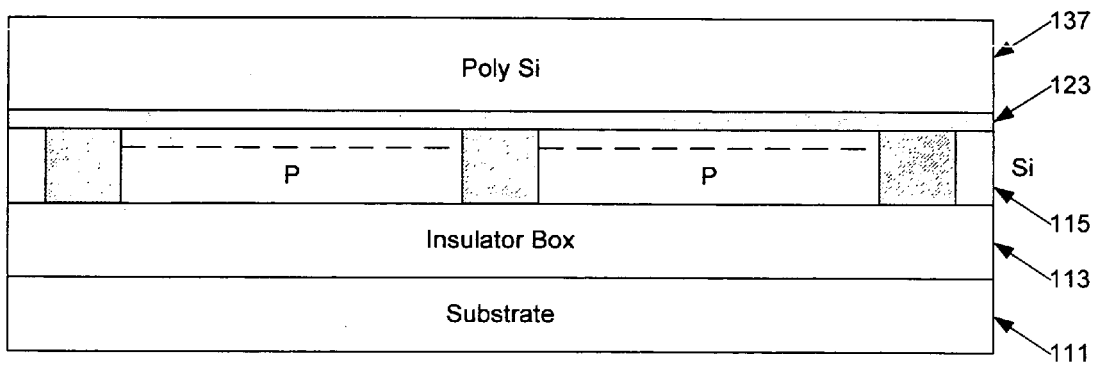
FIG. 6 is a cross-sectional view illustrating formation of a polysilicon layer.

The method of making the test structure also includes one or more steps S3 relating to forming a gate insulator layer 123 over the active device well (see FIG. 3), and forming a polysilicon layer 137 on the gate insulator layer 123 (see FIG. 6). The well may also be implanted with dopants to define a channel threshold (see FIG. 5). In the examples, the gate insulator layer 123 is applied prior to the initial doping of the well (see FIGS. 3 and 4). The polysilicon layer is applied after the well doping step (see FIG. 6).

Figure 7:
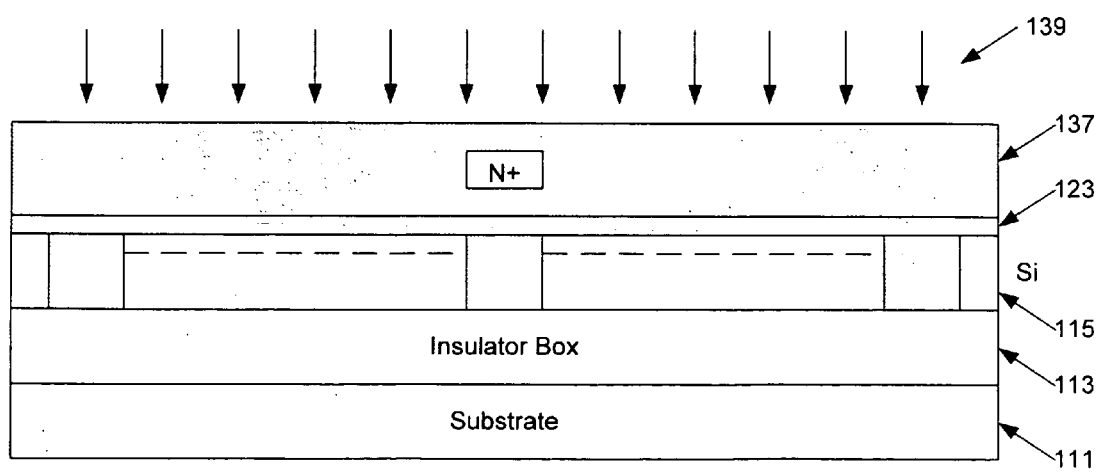
FIG. 7 is a cross-sectional view illustrating implantation of dopants and subsequent annealing of the polysilicon layer.

In a subsequent processing step S4, dopant of a second semiconductor type is implanted in the polysilcon layer. In the test structure, the intent is for this implantation to achieve a concentration level corresponding to that expected in the transistor gate. In an embodiment where the test structure is made during the manufacture of the transistor, this part of the process involves an initial implantation performed for gates of both devices (FIG. 7). However, the gate of the transistor will be subject to doping during some later steps, which is blocked off from further implantation in the gate for the test structure. Hence, the example for making the test structure involves an extra implantation in the area of polysilicon for the test structure gate (FIG. 8), in order to bring the concentration up to the level expected in the transistor gate.

Figure 9:
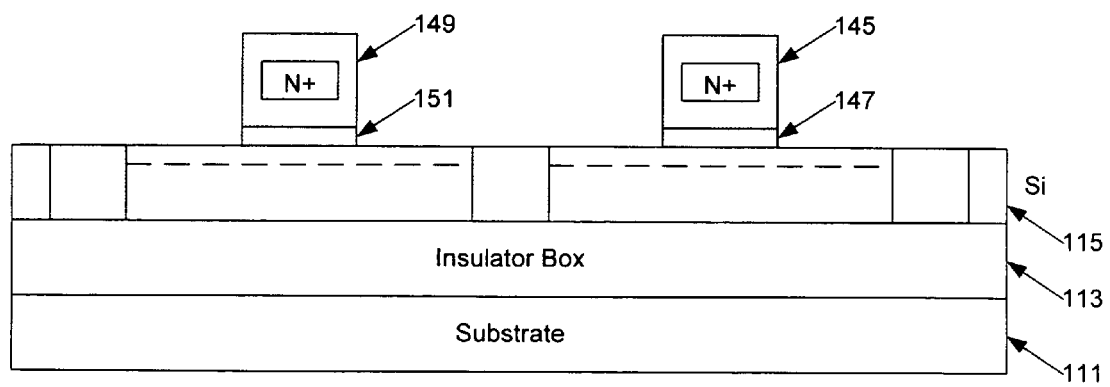
FIG. 9 is a cross-sectional view showing the gate patterning step.

After dopant implantation in the polysilicon layer 137, the method (FIG. 1) involves a step S5 for patterning the polysilcon layer 137 and typically the gate insulator layer 123, to form a gate for the test structure (see also FIG. 9). At least one dimension of the gate of the test structure substantially corresponds to an expected dimension of the gate of the transistor. In examples of structures used to test parameters for the transistor of interest, the width and length of the gate for the test structure are approximately the same as in the transistor of interest for testing purposes. In a test structure used for calibration, e.g. for a gate length measurement application, the test structure may be a larger area device, but typically one or more dimensions (e.g. width and height) will still closely correspond to the gate of the transistor.

Figure 11:
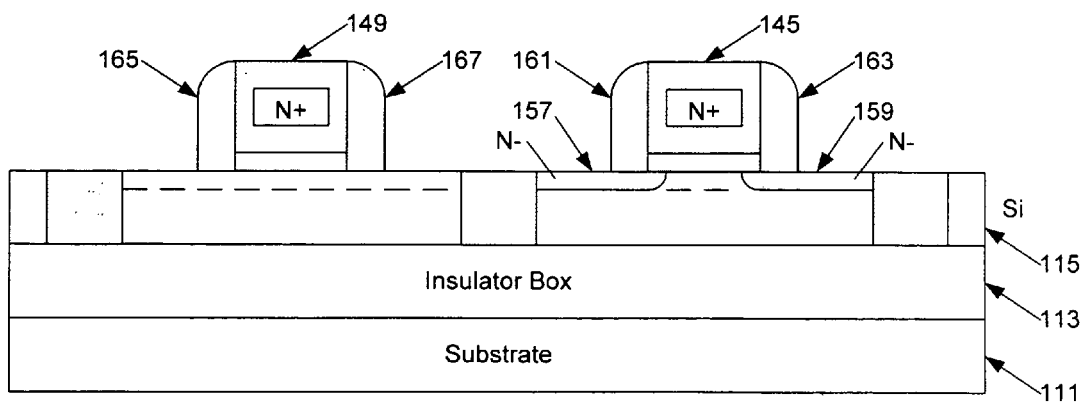
FIG. 11 is a cross-sectional view showing formation of gate sidewall spacers.

The method of making the test structure also includes a step S6 (FIG. 1) for forming insulating spacers on sidewall surfaces of the gate for the test structure (see FIG. 11). Dopant of the first semiconductor type is implanted into the active device well, to form regions 185 and 187 in the test structure (see FIG. 13). These regions correspond to the source 173 and drain 175 of the transistor of interest (see FIG. 12). However, the regions in the test structure are doped with opposite type dopant material. The regions 185 and 187 in the test structure, however, are implanted to a dopant concentration level that is substantially equal to a concentration of dopant of the second semiconductor type expected in source and drain regions 173, 175 of the transistor.

In the example, the steps for making the test structure are incorporated into and rely on many steps involved in the making of the NMOS device of interest. Although not discussed in detail, the process of manufacturing a complementary metal oxide semiconductor (CMOS) integrated circuit will also include steps for making the complementary devices, in this case PMOS devices and possibly one or more test structures for characterizing the PMOS devices. It is advantageous that the production of the test structure(s)

can be incorporated into the conventional process flow for making CMOS integrated circuits, with minimal additional steps relating to formation of the test structures.

It may be helpful now to consider a process for concurrent production of a transistor and its corresponding test structure in somewhat more detail. The exemplary process flow is illustrated in FIGS. 2–17.

Figure 2:
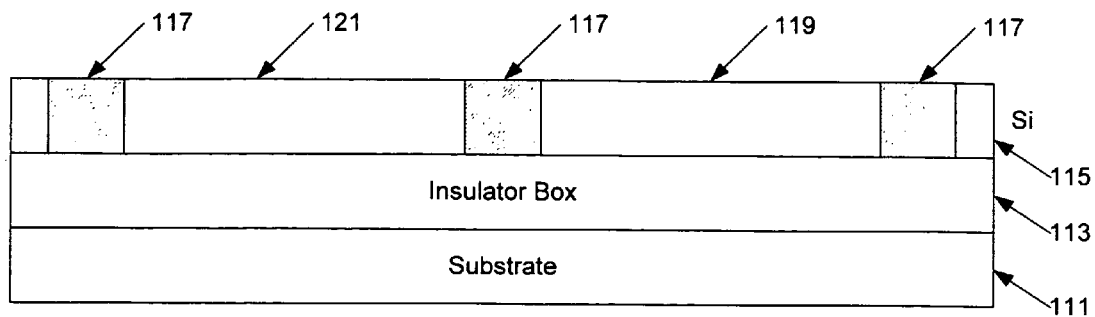
FIG. 2 is a cross-sectional view of a base structure for a silicon-on-insulator (SOI) type semiconductor device, showing two active device regions.

FIG. 2 illustrates a basic SOI structure in its early stages of fabrication. The structure includes the silicon substrate 111, the silicon oxide insulator layer (referred to as a 'box') 113 and the top silicon layer 115. Isolation regions 117 separate the active device regions of the top silicon layer. For purposes of discussion of one example, it will be assumed that the method produces one NMOS type transistor device 211 and one test structure 213, as shown for example in FIG. 18. To produce those two devices, the basic SOI structure of FIG. 2 includes two active devices regions or wells 119 and 121 separated from each other and from other active regions by the isolation regions 117. In an actual production device, there would be many active regions 119 for construction of many NMOS devices and a small number of active regions 121 for construction of test structures. There may also be many active regions for PMOS type devices as well as a small number of corresponding regions for one or more of the test structures used for analysis relating to the PMOS devices.

The basic structure of FIG. 2 may be formed via a SIMOX (Separation by Implantation of Oxygen) process. The SIMOX process involves implanting oxygen beneath the surface of a silicon wafer. An annealing step serves to coalesce the implanted oxygen atoms into a uniform layer 113 of $SiO_2$. Sometimes, epitaxial silicon may be grown atop the silicon to satisfy specific device requirements, but with or without an epitaxial layer, the top surface film 115 becomes the active structure for device fabrication. The buried oxide layer 113 is typically 0.1 to 0.5 μm thick and exhibits almost complete incorporation of the implanted oxygen. Typical implant energies range from 150 to 200 keV, while the oxygen dose may vary from 1 to $2E18/cm^2$. The thickness of top silicon film 115 as well as the variation thereof with respect to the thickness of the oxide layer 113 are functions of the implant energy and the rate of surface silicon sputtering during the implant process. The SOI formation process may also involve high temperature annealing, for example, at temperatures greater than 1250° C. for several hours, in order to coalesce the implanted oxygen and achieve solid state recrystallization of the top (superficial) silicon layer 115 from the surface downward.

The isolation regions 117 may be formed by a variety of known techniques. For example, one technique involves masking and etching to form thin trenches between and around the active regions 119 and 121. Following the formation of the trenches, a layer of oxide material is formed on the structure, for example, using high density plasma chemical vapor deposition (HDPCVD) to fill the trenches with the oxide material. Following deposition of the oxide material, the oxide material is polished via CMP, and any masking layers may be stripped by etching, to expose the upper surface level of active device regions 119 and 121 of the semiconductor layer 115. The surfaces of the isolation regions 117 are substantially planar with the surface level of active device regions 119 and 121.

Figure 3:
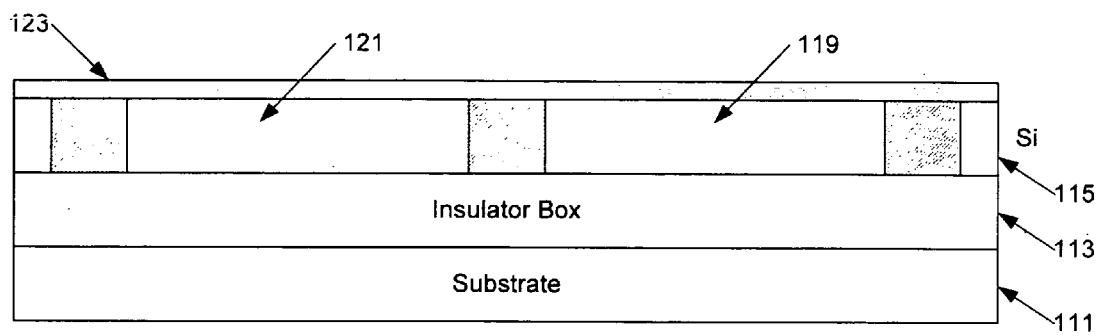
FIG. 3 is a cross-sectional view of the SOI structure showing formation of a gate oxide layer.

FIG. 3 shows formation of a thin oxide layer 123, for use as the gate insulator(s). The gate oxide material 123 may be laid down on the top silicon layer 115 and the isolation regions 117 as shown, or the gate oxide material 123 may be laid down on top silicon layer 115 only in the active regions 119 and 121 (i.e. only between the isolation regions 117). The thin gate oxide material 123 may have a thickness in the range of about 40 Å or less. The thin gate oxide material 123 typically includes $SiO_2$, which has a substantially low dielectric constant, although any suitable insulating material (e.g., $Si_3N_4$) may be employed.

Figure 4:
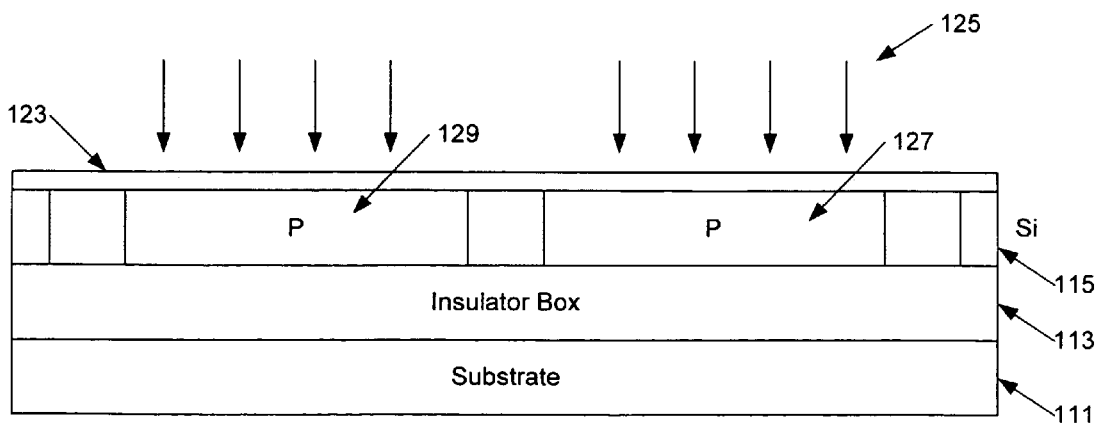
FIG. 4 is a cross-sectional view of the SOI structure showing implantation of P-Well dopants.

FIG. 4 illustrates implantation 125 of P-type dopants into the active device wells 119 and 121 formed in the top silicon layer 115, so as to form the desired P-type active semiconductor regions. In the example, the bodies of the active regions will become P-type semiconductor regions 127 and 129. The formation of the P-type semiconductor regions 127 and 129 involves masking a portion of the top silicon layer 115 with a photoresist layer (not shown) formed on top of the gate oxide layer 123 and implanting P-well dopants to provide the P-type bodies, for example, with dopant concentrations of around $3-7 \times 10^{17}/cm^3$.

FIG. 5 represents the N-channel threshold implant step. This step involves implantation 131 of N-type dopants into the P-type semiconductor regions 127 and 129. This implantation step forms lightly doped N-type regions 133 and 135 along the surfaces of the P-type semiconductor regions 127 and 129, respectively. This step typically involves masking a portion of the top silicon layer 115 with a photoresist layer (not shown) formed on top of the gate oxide layer 123. The mask may be the same as that used in the preceding step of implanting P-type dopants into the wells. When so masked, the step of FIG. 6 entails implanting N-type dopants at 131, to provide the N-type channel threshold regions 133 and 135, for example, with dopant concentrations of around 2–100 keV, B11 or BF2 for NMOS. The channel threshold implants 133 and 135 will typically extend into the semiconductor regions 127 and 129 to a desired depth below the surface of the top silicon layer 115.

The steps represented by FIGS. 6–9 relate to formation of the gates of the NMOS device and the test structure. As shown in FIG. 6, a polysilicon layer 137 is deposited on top of the gate insulator layer formed by the thin gate material 123. The polysilicon layer 137 may have a thickness within the range of about 1000 to 2000 Å, although the thickness of the layer 137 should be chosen to account for any subsequent polishing that might be performed to form the various gates. The polysilicon layer 137 may be formed by chemical vapor deposition (CVD), although any type of film formation process may be used.

Once formed, the polysilicon film 137 is pre-doped via, for example, ion implantation 139 in order to lower the resistivity of the polysilicon, as illustrated in FIG. 7. In the example, this implantation step 139 effects an N+ pre-doping. The pre-dopant concentration of the polysilicon film 137 may be in a range around $10^{20}/cm^3$. In this example, the N+ pre-doping is followed by Rapid Thermal Annealing, represented as part of FIG. 7. This annealing may be performed immediately after the doping of the polysilicon as shown, or it may be performed later after other implantation steps. For example, the range for implant energy may be 3–50 keV, and the type of implant may be Phos. or Arsenic at concentration in a range of 1e19–1e21.

To this point in the process, the standard NMOS device and the corresponding test structure have been treated equally. The dimensions and doping have been essentially identical. However, some of the subsequent processing differs between the test structure and the NMOS device that will be characterized by measurements on the test structure. Although the NMOS device and the test structure will differ in some regards, certain conditions on the test structure match or mirror the NMOS device, so that the test structure will have similar parameters to the NMOS device when both devices are complete.

Figure 8:
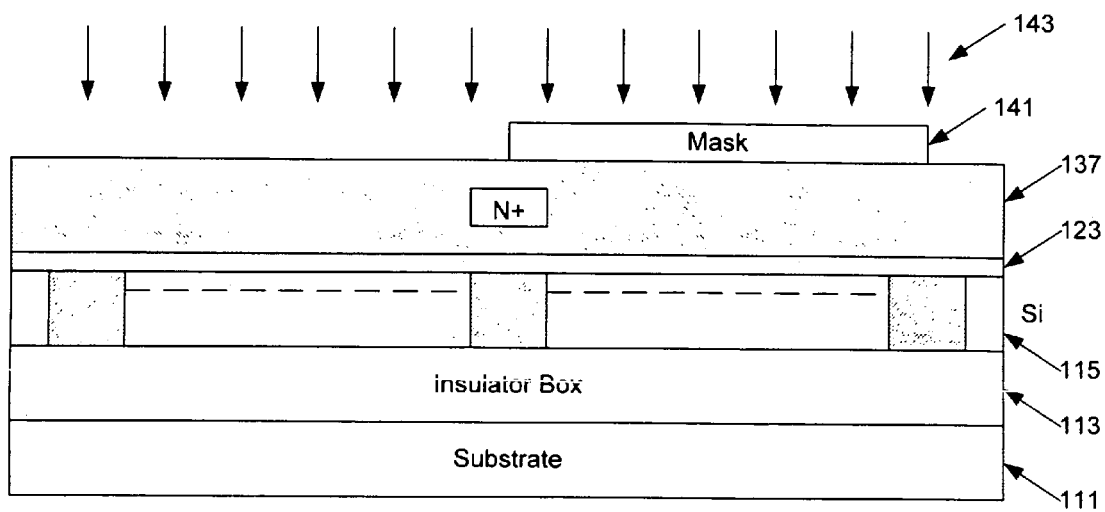
FIG. 8 is a cross-sectional view showing implantation of additional dopants in the portion of the polysilicon layer over the region that will form the test structure.

For example, a number of subsequent N+ implantation steps to form elements of the NMOS device will implant additional N-type dopants into the gate of the NMOS device, further lowering the resistivity of the transistor gate. The gate of the test structure, however, will be masked during these subsequent doping steps (as described below) and will not receive additional N-type doping. It is desirable that the characteristics of the gate of the test structure correspond to those of the gate of the NMOS device. To compensate for the masking in subsequent doping steps, the illustrated method therefore includes an additional pre-dope step, applied only to the portion of the polysilicon layer 137 that will be used to form the gate of the test structure, as shown in FIG. 8.

A mask 141 is applied to the polysilicon layer 137 over the region for the NMOS device. The exposed portion of the polysilicon film 137 is again pre-doped via, for example, ion implantation as shown at 143 in FIG. 8. This further N+ pre-doping typically uses implant energies ranging from around 1 keV to approximately 20 keV, and the implant dose may vary from 1E15 to 1E16/cm$^2$. The dopant material may be arsenic, or the like. This additional processing of the polysilicon for the test structure could involve a further Rapid Thermal Annealing, at this time or as part of a later general annealing of the semiconductor device.

The next step involves patterning of the polysilicon and insulator layers to form the gate electrodes and the underlying gate insulators, that is to say, to form the structure as shown by way of example in FIG. 9. The gate and insulator formation, for example, may entail a standard dry anisotropic etch process, although other patterning techniques may be utilized. As a result of this processing, the illustrated SOI integrated circuit now includes a gate 145 having an N+ doping characteristic and an underlying gate insulator layer 147, for use in the NMOS device. The illustrated SOI integrated circuit also includes a gate 149 having an N+ doping characteristic and an underlying gate insulator layer 151, for use in the test structure. In this example, the height, width and length dimensions of the gate 149 and the gate insulator 151 for the test structure are substantially the same as those of the gate 145 and the gate insulator 147 for the NMOS transistor. However, in view of the extra pre-doping step 143 (FIG. 10), the N+ doping concentration in the gate 149 is higher than that in the gate 145, at this stage of the process.

Figure 10:
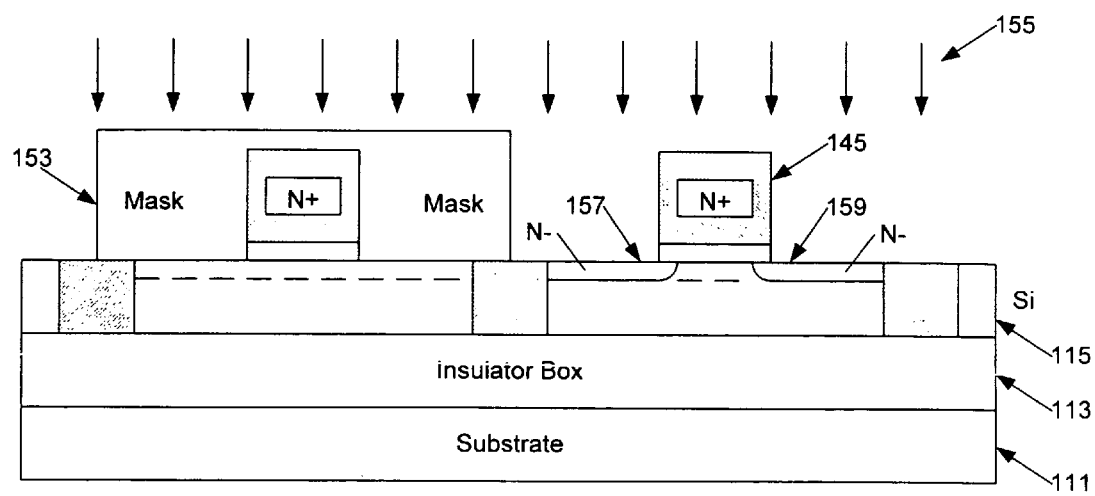
FIG. 10 is a cross-sectional view illustrating implantation of dopants for formation of source/drain extension regions for the NMOS device.

FIG. 10 represents the N− dopant implantation to form the source/drain extensions for the normal NMOS device. During formation of the source/drain extensions, portions of the test structure are masked, to prevent implantation of the dopants and formation of extensions in the test structure. Hence, the processing represented by FIG. 11 involves forming a mask 153 over the polysilicon gate and the exposed portions of the active device well, for the test structure. Once the test structure portions are masked, the N− dopant implantation at 155 forms a lightly doped source extension 157 and a lightly doped drain extension 159. The implantation uses the polysilicon gate 145 as a mask to effectively self-align the extension regions 157 and 159, as illustrated in FIG. 10. Those skilled in the art will recognize that other methods of forming the extension regions 157 and 159 may be employed. The N− extensions may have dopant concentrations around 10$^{18}$/cm$^3$. After the formation of the extension regions, an anneal may be performed; alternatively, a single anneal may be performed later in the process after the formation of the source/drain regions. As a result, the regions 157 and 159 will typically extend somewhat under the gate 145, creating gate overlaps.

As noted, during the formation of the N− extensions, a mask 153 prevents implantation of the N-type dopants in step 155 into elements of the test structure. As a result, the test structure will not include source/drain extensions within the active device well, and the gate is not further doped. Overlap between the gate and the source drain extensions in the transistor prevents scaling of gate current to gate or channel length, so since the test structure has no overlap (see FIGS. 18 and 19), the test structure 213 will exhibit a substantially linear relationship of gate current to gate/channel length. A difference in gate length results in a corresponding difference in current.

After extension formation for the NMOS device (FIG. 10), the mask 153 is removed from the test structure. Dielectric or insulating spacers are formed along the sidewalls of the gates, as shown in FIG. 11. For the NMOS device, this step produces sidewall spacers 161 and 163 on opposite sides of the gate 145 and the underlying gate insulator. For the test structure, this step produces sidewall spacers 165 and 167 on opposite sides of the gate 149 and the underlying gate insulator. In this example, all of the sidewall spacers have similar dimensions and consist of the same insulating material.

The sidewall spacers 161, 163 165 and 167 may be formed, for example, by CVD oxide deposition followed by a directional etching such as, for example, reactive ion etching (RIE). The spacer material layer may comprise tetraethoxysilane (TEOS) oxide, silicon dioxide, silicon nitride or the like. Of course, other techniques or insulating materials may be employed to form the various sidewall spacers.

Figure 12:
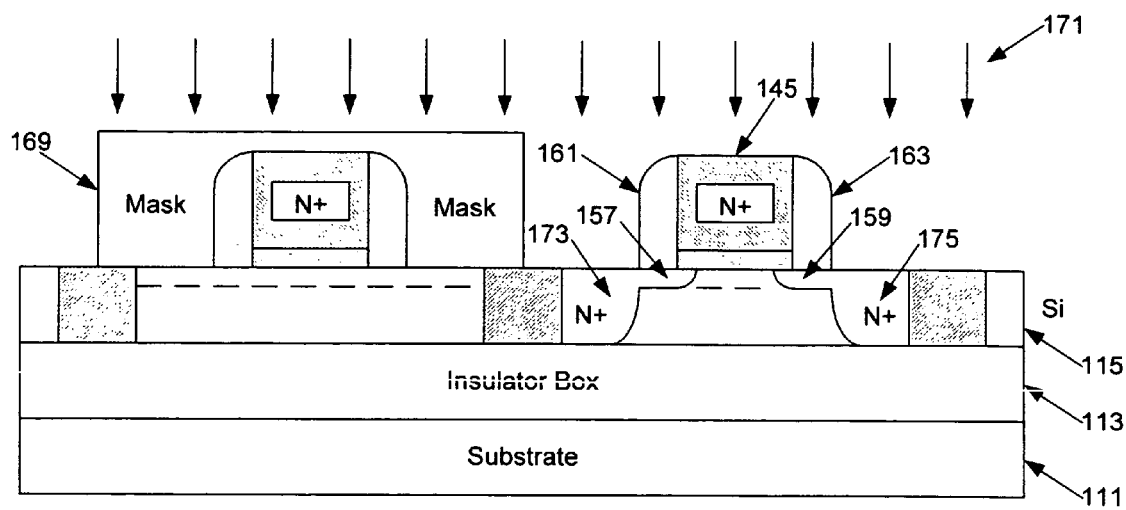
FIG. 12 is a cross-sectional view illustrating deep implantation of dopants for formation of source/drain regions for the NMOS device.
Figure 13:
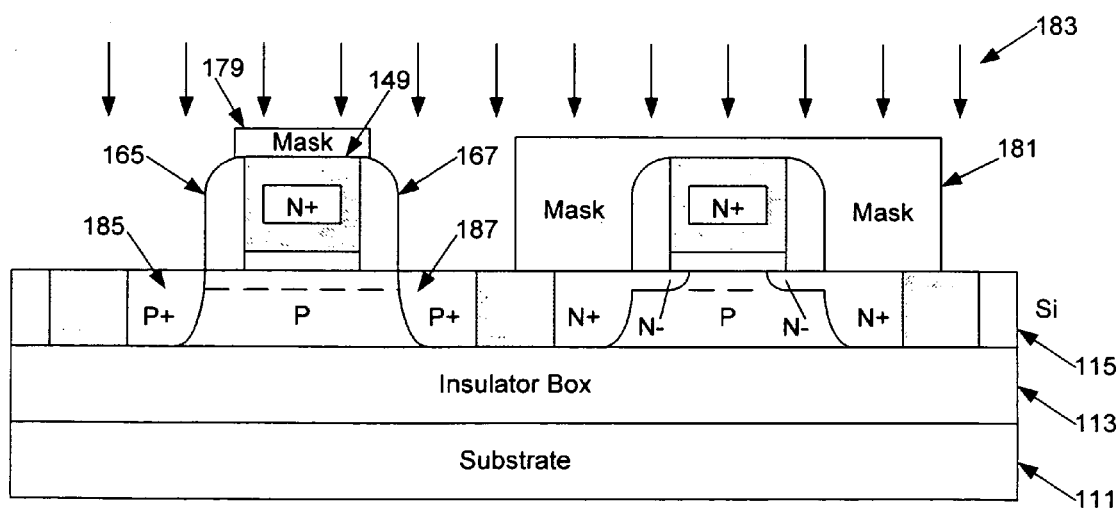
FIG. 13 is a cross-sectional view illustrating deep implantation of dopants of an opposite type for formation of regions of the test structure emulating source/drain regions of the NMOS device.

FIG. 12 represents the deep implantation of N+ dopant to form the source/drain regions for the normal NMOS device. During formation of the source/drain regions, portions of the test structure are again masked, to prevent receipt of the dopants and thus prevent formation of N-type source/drain regions in the test structure, although the gate 145 of the NMOS transistor receives further N type doping. Hence, the processing represented by FIG. 12 involves forming a mask 169 over the polysilicon gate and the exposed portions of the active device well, for the test structure. Once the test structure portions are masked, the N+ deep doping at 171 forms a deeply doped source region 173 and a deeply doped drain region 175. Implant energy, for example, may be 3–50 keV, and the type of dopant may be Phos. or Arsenic at a concentration in the range 1e19–1e21.

The spacers 161 and 163 on the sidewalls of the gate 145 of the NMOS device act as masks over the source and drain extensions, to prevent further implantation of N-type dopants into the extensions 157 and 159. Consequently, the extensions 157 and 159 remain lightly doped (N− in the example) and have doping concentrations essentially as implanted in the earlier step (FIG. 10). During formation of the N+ source/drain regions 173 and 175 (FIG. 12), portions of the test structure are masked, to prevent receipt of the N+ dopants and formation of N type source drain regions in the test structure. After the formation of the source and drain regions, an anneal may be performed; alternatively, a single anneal may be performed later in the process after the formation of the corresponding regions in the test structure.

The mask 169 is removed from the test structure. In the example, the next step is to form P+ regions in the test device, substantially corresponding to source drain regions 173 and 175 of the NMOS device. However, to prevent P-type doping of the gate 149, a mask 179 is formed on the gate to block P-type implantation. Also, a mask 181 is formed over the normal NMOS device to block introduction of P-type dopants into any of the elements of the NMOS device.

Before the p+ source and drain regions are formed, the mask(s) on the gate should be longer than the gate length. In the example, it is important for the p+ source and drain regions to NOT get into the gate and change the dopant profile. It is okay for the p+ source and drain regions to be placed away from the spacer if needed—in other words the mask could come all the way to the edge of the spacer. In general that would depend on the alignment tolerance for the technology.

At 183, the test structure is subjected to the P+ deep doping. This implantation step forms the P+ regions shown at 185 and 187 in FIG. 13. Although the highly doped (P+) regions 185 and 187 do not actually function as a source and drain of a field effect transistor, since they are not N-type regions (do not form an NPN transistor with the channel), they correspond in size, shape and doping concentration to the source 173 and drain 175 of the corresponding NMOS transistor. Hence, for ease of discussion, the P+ regions 185 and 187 of the test structure are referred to as the source and drain of the test structure.

The intent is for elements of the test structure to correspond closely to those of the NMOS transistor that the test structure will emulate. Although the dopant type differs, the dimensions and dopant concentrations of the source 185 and drain 187 of the test structure are substantially the same as those of the source 173 and drain 175 of the corresponding NMOS device. Another difference between the source and drain of the NMOS device and the test structure is that the NMOS device includes the extensions 157 and 159, whereas the P+ source and drain in the exemplary test structure do not include any corresponding extensions.

After removal of the masks (FIG. 14), the NMOS transistor and the test structure are relatively complete. Processing could go forward with formation of sealing/insulators over both devices, vias through the insulators and contacts through the vias for electrical connections. However, in the example, a series of intermediate steps are performed to form silicide layers, for example in the gates and in the source and drain regions, of both the normal NMOS transistor device and the test structure, which facilitate the electrical connections.

Figure 14:
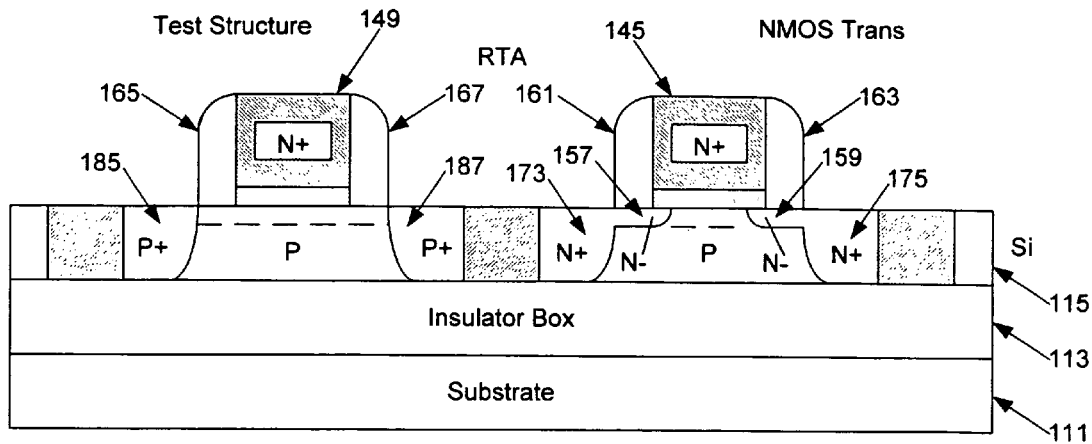
FIG. 14 is a cross-sectional view showing the NMOS device and the test structure, after removal of masks used in the preceding step.
Figure 15:
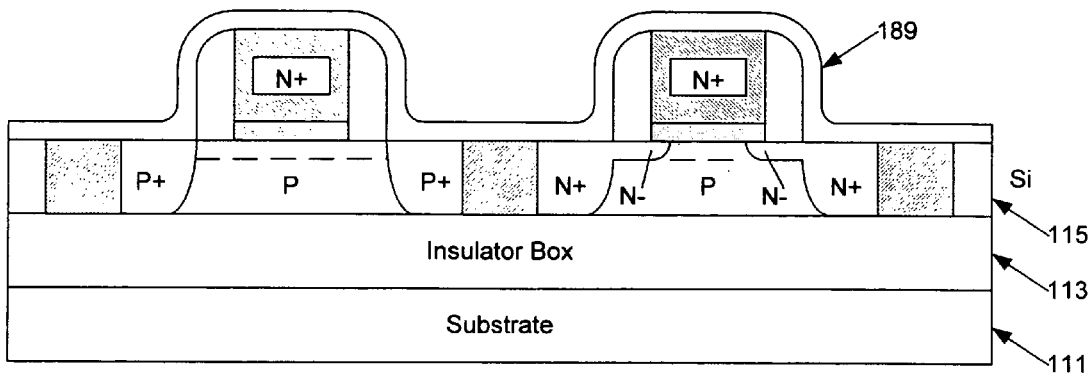
FIG. 15 is a cross-sectional view showing deposition of a metal layer for silicide formation.

As illustrated in FIG. 15, silicide formation is initiated by depositing a layer of metal 189 across the exposed surfaces of the semiconductor devices, including the gates 145 and 149, and the various source drain regions 173, 175, 185 and 187 (compare to FIG. 14). The metal layer 189 may be formed from a suitable metal, such as titanium, cobalt, or nickel. The metal layer 189 may be deposited, for example, by sputtering.

The desired silicide regions are then formed by reacting the metal layer 189 with the underlying surface portions of the gates 145 and 149, and the various source drain regions 173, 175, 185 and 187, that is to say, the regions of the NMOS device and the test structure in contact with the metal layer 189. This silicide formation step may utilize any one of a number of silicidation or salicidation processes. An exemplary technique employees thermal annealing, which essentially raises the temperature of the semiconductor devices to a suitable level (e.g., about 500° C. to about 700° C.) for a suitable length of time (e.g., about 10 seconds to about 10 minutes). Rapid thermal annealing (RTA) may also be employed, for example at a temperature of about 600° C. to about 900° C. for about 5 second to about 120 seconds. It will be appreciated that other temperatures and heating times may be employed.

Figure 16:
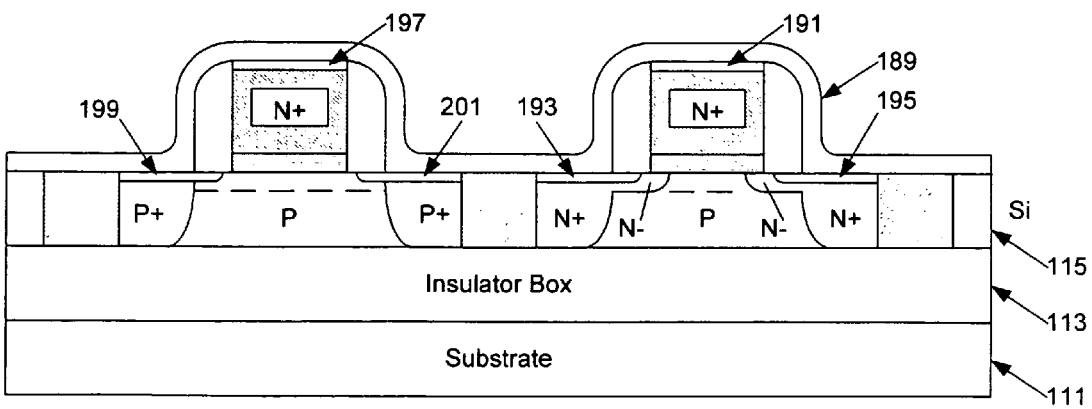
FIG. 16 is a cross-sectional view of showing treatment to form silicide layers within the NMOS device and the test structure.

The chemical reaction of the metal layer 189 with the exposed semiconductor elements forms a number of silicide regions. In the NMOS transistor device, the processing forms a silicide region 191 on the gate, as well as silicide regions 193 and 195 on the source and drain of the NMOS device, as shown in FIG. 16. In the test structure, the processing forms a silicide region 197 on the gate, as well as silicide regions 199 and 201 on the source and drain of the test structure, as further shown in the drawing. As illustrated, the silicide regions 193, 195, 199 and 201 will tend to encroach underneath the respective sidewall spacers. In an example, these silicide regions will encroach under the sidewall spacers a lateral distance of about zero to about 100 Å.

Figure 17:
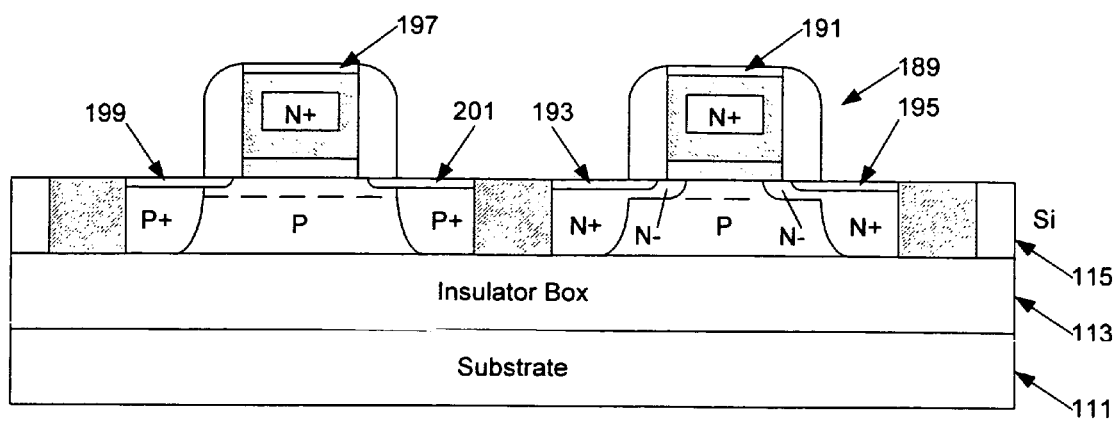
FIG. 17 is a cross-sectional view of SOI integrated circuit showing the NMOS device and the test structure, after removal of the metal layer used for silicide formation.

Unreacted metal in the metal layer 189 is removed to expose the underlying layers. FIG. 17 shows the NMOS device and the test structure, after removal of the metal layer 189. The silicide layers are now exposed to allow formation of contacts (not shown), for purposes of making electrical circuit connection to the various device elements. The silicide layers reduce contact resistance of subsequent connections to the various regions of the test structure and the NMOS device.

Figure 19:
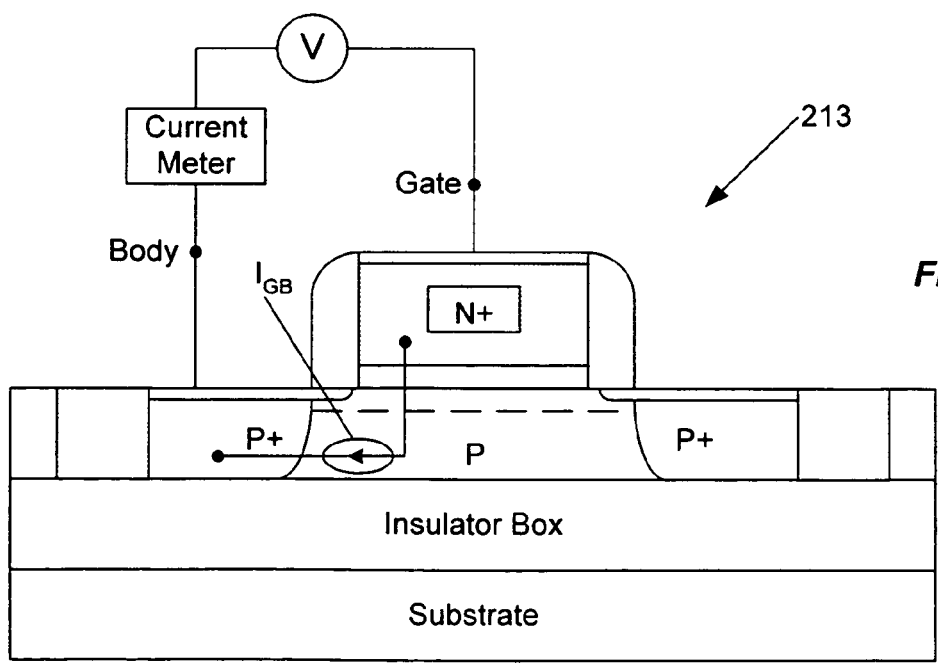
FIG. 19 is a cross-sectional view of the test structure (alone), which also shows the measurement of current for purposes of one or more test applications.
Figure 18:
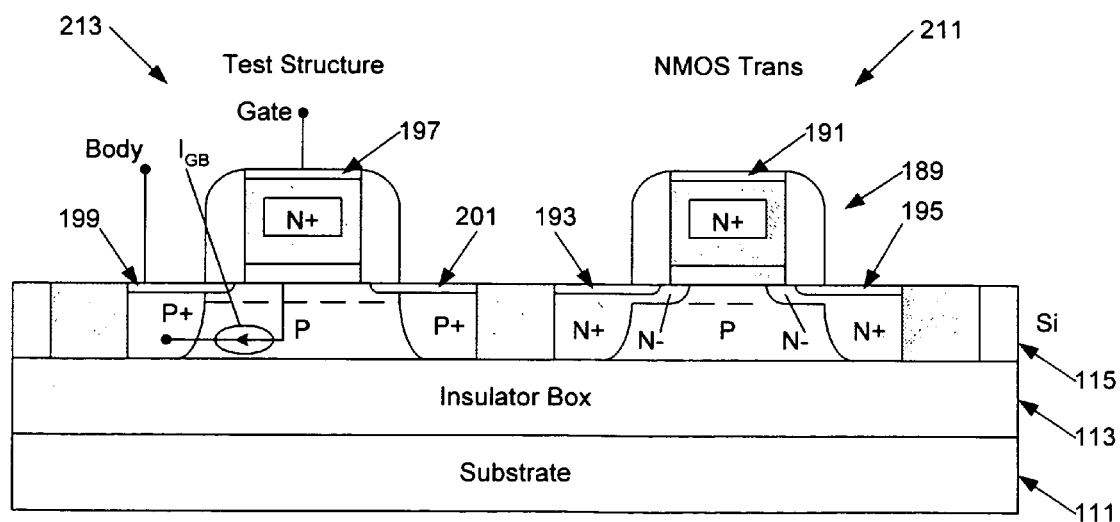
FIG. 18 a cross-sectional view of SOI device showing the NMOS transistor and the test structure, useful in explaining measurements conducted on the test structure.

FIG. 18 shows the NMOS device 211 and the test structure and illustrates a current flowing between the gate and one of the P+ source/drain regions of the test structure 213. FIG. 19 is an enlarged view of the test structure 213 showing the application of a voltage (V) across contacts for the gate and the body and use of a meter to measure the current gate-body current ($I_{GB}$) flowing through the test structure.

The resulting test structure 213 looks like an MOS type field effect transistor (MOSFET). The illustrated test structure 213 does not include the NPN (or PNP) type regions normally found in a transistor. Essentially, the structure comprises a gate, an insulator and a semiconductor well having a number of different dopant levels. As such, the test structure is a form of integrated circuit type capacitor. However, the characteristics of the test structure 213 are designed to enable testing thereof to provide an accurate indication of gate current as it would appear in a corresponding transistor device.

The areas, depths/heights and concentrations of many elements of the test structure 213 are substantially similar to those of corresponding elements 149 in the transistor 211 of interest. However, the test structure lacks halos or extensions in the source/drain regions. Hence the gate 149 of the test structure does not substantially overlap the source 185 or the drain 187. Also, the test structure has P+ regions for the source 185 and the drain 187, where the conventional NMOS transistor 211 has N+ regions for its source 173 and drain 175. The elimination of halos and/or extensions and the use of dopants of the same type as the body, enable testing of the structure 211 to accurately measure only the intrinsic gate-body current that would normally appear in the similar NMOS transistor of interest. Also, the P-body formed within the semiconductor region 129 is well contacted by the low resistance P+ source or drain region (185 or 187). In a calibration type test device, the gate has a known wide area. In a test device corresponding to an actual transistor, the gate width and length are substantially the same as for the gate in the transistor of interest.

In each active semiconductor region 127 or 129, the portion thereof other than the source/drain regions 173, 175 or 185, 187 may be considered as the semiconductor body.

In an SOI transistor, such as NMOS device 211, the body floats relative to ground in that there is no specific potential or voltage value applied to the body of such a transistor. In fact, a normal operational SOI transistor does not have any electrical connection to the body portion of the device. The P+ 'source/drain' emulation regions 185, 187 in the test structure 213, however, provide a means to electrically connect to the body in the test structure, for example, to measure current flow through the body. Measurements on the test structure have at least two significant applications of interest.

Gate-body current ($I_{GB}$) is known to impact floating body effects in SOI devices. As noted in the background, direct analysis of the gate-body tunneling current in actual devices is difficult, since tied-body structures used to extract a measure of that current introduce a large error due to the body tie connection to the device. However, measurements taken on the test structure 213 can provide representative data regarding the intrinsic gate-body tunneling current that would actually be present in the corresponding NMOS device 211. Knowledge of the gate-body tunneling current, from measurements on the test structure, are useful in modeling of the current for characterizing floating body effects in circuits.

In the production methodology outlined above, the test structure 213 was carefully constructed to match one or more regular NMOS devices 211 (often there are many similar NMOS devices 211 in the same integrated circuit). For example, the dimensions of the active well, the gate, channel and source drain of the test structure were the same as those of the regular MNOS devices 211, the dopants in the channel implant and the gate were the same in the test structure 213 and the MNOS device 211, and the P-type dopants in the source region 185 and the drain region 187 have concentration levels that correspond to those of the N-type dopants in the source region 173 and the drain region 175 of the NMOS device 211. As such, measurements taken on the test structure 211 fairly characterize properties of the corresponding NMOS device 213.

However, the SOI integrated circuit may include one or more implementations of the test structure that do not correspond in size to a particular NMOS device 211. For example, the SOI integrated circuit may include a test structure produced by a similar technique but having "large area," for calibration purposes. The gate-body current measurement, using the test structure 213 corresponding to the NMOS device 211, together with a calibration measurement of a large area test structure, can be used to characterize the actual physical gate dimensions. Essentially, the gate current is proportional to the gate length in the test structure. In the conventional MOSFET, the overlap of the gate over the extensions of the source and drain regions skews the relationship of current to gate length. By using the test structure built to have gate dimensions that correspond to those of the gate of the MOS transistor device, it is possible to directly extract the physical gate length of interest by measuring current in the test structure 211.

An example of a gate length measurement involves the following steps. First, the current through the gate ($I_G$(cal)) is measured on a large area test structure, for example, a test structure having an area around $$100\ \mu m^2 (W \times L = 10\ \mu m \times 10\ \mu m).$$

The width W for the wide area device should be the same as that in the test structure 211 (and the actual device 213 of interest). Based on the calibration measurement on the large area device, a gate current per unit gate length is determined (normalized value), that is to say $$V = I_G(\text{cal}) \div L(\text{cal}),$$

where V is the normalized value (units of current/$\mu m^2$).

The next step involves measuring gate current on the test structure 213 corresponding to the NMOS device 213 of interest. The voltages applied to the test structure 213 are the same as in the measurements on the large area test structure, in the calibration step. The ratio of the measured gate current from the test structure 213 ($I_G$(test)) to the normalized current per unit length V equals the number of units of length of the gate in the test structure 213, or $$L(\text{test})\mu m = I_G(\text{test}) \div V.$$

Since the test structure 213 has gate dimensions corresponding to those of the NMOS device 213 of interest, the gate length (L(test)) derived from the current measurement substantially equals the gate length of the actual NMOS device 213.

The examples described in detail above focused on a test structure designed to mimic an NMOS transistor. For example, the gate 149 is doped with N+ materials, and the source 185 and the drain 187 are P+ regions. Those skilled in the art will appreciate, however, that the test structure and its manufacturing technique are equally adaptable to applications for testing in relation to a PMOS transistor (instead of the NMOS device 211). Essentially, the manufacturing processing is the same, except that the types of the dopants are reversed. Where P type dopants are used to build the test structure 213 for analysis of the NMOS type transistor 211 (the illustrated example), manufacture of a similar test structure for analysis of a PMOS type transistor would utilize N type dopants. Conversely, where N type dopants are used to build the NMOS test structure 213, manufacture of a similar test structure for PMOS would utilize P type dopants.

Also, the measurements on the test structure focused on applications to SOI type structures, e.g. gate body current which is relevant to floating body effects. However, those skilled in the art will recognize that the test structure and its method of manufacture may be adapted for use with bulk silicon-based MOS devices, for example, to measure the physical gate length of a bulk MOS device of interest.

While the foregoing has described what are considered to be the best mode and/or other examples, it is understood that various modifications may be made therein and that the invention or inventions disclosed herein may be implemented in various forms and examples, and that they may be applied in numerous applications, only some of which have been described herein. It is intended by the following claims to claim any and all modifications and variations that fall within the true scope of the inventive concepts.

What is claimed is:

1. A method of making a test structure for testing to analyze characteristics of a metal oxide semiconductor transistor, comprising:
    forming an active device well;
    implanting a dopant of a first semiconductor type in the active device well including a channel region, to a concentration level specified for implantation of first semiconductor type dopant in a well of the transistor;
    forming a gate insulator layer over the active device well;
    forming a polysilcon layer on the gate insulator layer;

implanting dopant of a second semiconductor type in the polysilicon layer, to a concentration level specified for a gate of the transistor;

patterning the polysilcon layer to form a gate for the test structure corresponding in at least one dimension to a dimension specified for the gate of the transistor;

forming insulating spacers on sidewall surfaces of the gate for the test structure; and deeply implanting dopant of the first semiconductor type into the active device well, to form regions in the test structure having concentration of dopant of the first semiconductor type substantially equal to a concentration of dopants of the second semiconductor type specified for source and drain regions of the transistor.

2. The method as in claim 1, wherein the step of forming the active device well comprises forming a silicon-on-insulator structure including a substrate, an insulator on the substrate and a semiconductor layer on the insulator, wherein the active device well comprises an isolated region of the semiconductor layer.

3. The method as in claim 1, wherein, following the step of implanting dopant of the first semiconductor type in the active device well, the method further comprises doping the active device well with dopant of the second semiconductor type to a concentration level substantially corresponding to a level specified to define a desired channel threshold for the transistor.

4. The method as in claim 1, further comprising rapid thermal annealing (RTA) of the polysilicon layer after the step of implanting dopant of the second semiconductor type in the polysilcon layer.

5. The method as in claim 4, further comprising rapid thermal annealing (RTA) of the test structure after completion of the step of deeply implanting dopants to form the regions in the test structure.

6. The method as in claim 1, further comprising forming silicide regions in the gate of the test structure and in said regions in the test structure.

7. The method as in claim 1, wherein the dopants of the first semiconductor type are P-type, and the dopants of the second semiconductor type are N-type.

8. The method as in claim 1, wherein the dopants of the first semiconductor type are N-type, and the dopants of the second semiconductor type are P-type.

9. The method as in claim 1, wherein the gate of the test structure has a length dimension substantially corresponding to a length dimension specified for a gate of the transistor.

10. A method of making a metal oxide semiconductor transistor and an associated test structure for testing to analyze characteristics of the metal oxide semiconductor transistor, the method comprising:

forming a structure having two active wells, one well providing a channel region for the transistor and one well providing a channel region for the test structure;

implanting dopant of a first semiconductor type in both wells, to a concentration level intended for the active well for the transistor;

forming a gate insulator layer and a polysilcon layer over both wells;

implanting dopant of a second semiconductor type in the a polysilcon layer over both wells;

masking a portion of the polysilcon layer over the well for the transistor, and implanting dopant of the second semiconductor type in a portion of the polysilcon layer over the well for the test structure, to produce a concentration of dopant in the portion of the polysilicon layer over the well for the test structure substantially corresponding to a concentration for a gate of the transistor;

patterning the polysilcon layer and the gate insulator layer to form a gate for the test structure over the well for the test structure and to form the gate for the transistor over the well for the transistor;

masking the well for the test structure and the gate for the test structure, and lightly implanting dopants of the second semiconductor type into the well for the transistor, to form source and drain extension regions;

forming insulating spacers on sidewall surfaces of both gates;

masking the well for the test structure and the gate for the test structure, and deeply implanting dopants of the second semiconductor type into the well for the transistor, to form source and drain regions of the transistor, having a predetermined concentration of the dopants of the second semiconductor type; and masking the transistor and the gate for the test structure, and deeply implanting dopant of the first semiconductor type into the well for the test structure, to form regions in the test structure having concentration of dopants of the first semiconductor type substantially equal to the predetermined concentration of the dopant of the second semiconductor type in the source drain regions of the transistor.

11. The method as in claim 10, wherein the step of forming a structure having two active wells comprises:

forming a silicon-on-insulator structure comprising a substrate, an insulator on the substrate and a semiconductor layer on the insulator; and dividing the semiconductor layer into the two active wells separated by an isolation barrier.

12. The method as in claim 10, wherein, following the step of implanting dopant of the first semiconductor type in both wells, the method further comprises implanting dopant of the second semiconductor type in both wells, to a concentration level sufficient to define a desired channel threshold for the transistor.

13. The method as in claim 10, further comprising rapid thermal annealing (RTA) of the polysilcon layer over both wells after the step of implanting dopant of the second semiconductor type in the polysilicon layer over both wells.

14. The method as in claim 13, further comprising rapid thermal annealing (RTA) both the transistor and the test structure after completion of the deep implanting steps.

15. The method as in claim 10, further comprising forming silicide regions in the gates of both the transistor and the test structure, in the source and drain regions of the transistor, and in the regions in the test structure.

16. The method as in claim 10, wherein a dimension of the gate of the test structure is substantially equal to a dimension of the gate of the transistor.

17. The method as in claim 10, wherein the dopants of the first semiconductor type are P-type, and the dopants of the second semiconductor type are N-type.

18. The method as in claim 10, wherein the dopants of the first semiconductor type are N-type, and the dopants of the second semiconductor type are P-type.

* * * * *